United States Patent [19]

Keller et al.

[11] 4,126,509

[45] Nov. 21, 1978

[54] PROCESS FOR PRODUCING PHOSOPHOROUS-DOPED SILICON MONOCRYSTALS HAVING A SELECT PERIPHERAL DOPANT CONCENTRATION ALONG A RADIAL CROSS-SECTION OF SUCH MONOCRYSTAL

[75] Inventors: Wolfgang Keller; Herbert Kramer, both of Munich; Konrad Reuschel, Vaterstetten, all of Germany

[73] Assignee: Siemens Aktiengesellschaft, Berlin & Munich, Germany

[21] Appl. No.: 735,583

[22] Filed: Oct. 26, 1976

[30] Foreign Application Priority Data

Nov. 14, 1975 [DE] Fed. Rep. of Germany ....... 2551301
Nov. 14, 1975 [DE] Fed. Rep. of Germany ....... 2551281

[51] Int. Cl.² .................. B01J 17/12; B01J 17/40
[52] U.S. Cl. .................. 156/605; 156/620; 156/DIG. 64
[58] Field of Search ....... 156/605, 606, 620, DIG. 73, 156/DIG. 64; 75/65 ZM; 13/13 ZM; 252/301.4 P, 301.4 F; 423/299, 324

[56] References Cited

U.S. PATENT DOCUMENTS

| 2,854,363 | 9/1958 | Seiler .................. 156/606 X |
| 3,167,512 | 1/1965 | Ziegler .................. 156/606 |
| 3,177,051 | 4/1965 | Scholte .................. 156/620 |
| 3,210,165 | 10/1965 | Van Run et al. .......... 156/620 X |
| 3,585,008 | 6/1971 | Keller et al. ............ 156/620 |
| 3,773,499 | 11/1973 | Melnikov ................ 156/620 |
| 3,804,682 | 4/1974 | Keller .................. 156/606 |
| 3,915,660 | 10/1975 | Keller et al. ............ 156/620 |
| 3,954,416 | 5/1976 | Keller .................. 156/605 |

FOREIGN PATENT DOCUMENTS

2,500,728  7/1975  Fed. Rep. of Germany ........... 156/605
894,739  4/1962  United Kingdom ................ 156/620

OTHER PUBLICATIONS

Tanenbaum et al., "Preparation of Uniform Resistivity n-Type Silicon by Nuclear Transmutation," J. Electro Chem. Soc., vol. 108, No. 2, pp. 171-176 (Feb. 1961).

*Primary Examiner*—Stephen J. Emery
*Attorney, Agent, or Firm*—Hill, Gross, Simpson, Van Santen, Steadman, Chiara & Simpson

[57] ABSTRACT

A process for producing phosphorous-doped silicon monocrystals having a select peripheral depletion or enrichment of dopant atoms along the radial direction of such monocrystals comprises providing a silicon monocrystalline rod homogeneously doped with phosphorous, as by neutron doping, and subjecting such homogeneously doped monocrystalline rod to a peripheral zone melt cycle in a select atmosphere such that the peripheral melt zone depth within the monocrystalline rod is controlled so as to be less than the radius of the rod in accordance with the desired peripheral dopant concentration in the ultimately attained rod.

2 Claims, 5 Drawing Figures

PROCESS FOR PRODUCING PHOSOPHOROUS-DOPED SILICON MONOCRYSTALS HAVING A SELECT PERIPHERAL DOPANT CONCENTRATION ALONG A RADIAL CROSS-SECTION OF SUCH MONOCRYSTAL

BACKGROUND OF THE INVENTION

1. Field of the Invention

The invention relates to doped silicon monocrystalline rods and somewhat more particularly to a process of producing phosphorous-doped silicon monocrystalline rods having a peripheral radial depletion or enrichment of the dopant therein.

2. Prior Art

Generally, it is desirable to produce silicon monocrystalline rods for use in manufacturing semiconductor components so that such rods have as homogeneous a dopant distribution as possible throughout the entire cross-section of the rod. However, in the manufacture of special semiconductor components, such as, for example, large-area power thyristors having a high reserve power rating, wherein one desires to insure that the reverse voltage and the blocking capacity are approximately equal, or large-area thyristors with an integrated three-layer diode wherein the breakdown voltage of the diode is below the trigger voltage of the thyristor, silicon crystals are used which have a homogeneous radial resistance ($\rho$) profile or path in the center of the wafer or disc cut from such a rod and a preselect peripheral rise or drop in the electrical resistance profile at the edge of such wafer (i.e., silicon crystalline wafers having either a dish-shaped resistance profile or an inverse resistance profile). To attain such wafers, the monocrystalline rod must have a dopant distribution in the peripheral zones thereof which is lower or higher than the dopant distribution in the central zone thereof.

SUMMARY OF THE INVENTION

The invention provides a process for providing a phosphorous-doped silicon monocrystalline rod having a select dopant concentration or distribution along peripheral radial cross-sections thereof which are different from the dopant concentration in the center zone of such rod.

In accordance with the principles of the invention, a silicon monocrystalline rod having a substantially homogeneous dopant concentration throughout the rod is subjected to at least one peripheral zone melt cycle in a select gas atmosphere under such conditions that a peripheral melt zone is generated on the rod so as to have a depth less than the radius of the rod and is drawn at least once through the length of the rod. In this process, the depth of the peripheral melt zone (ranging from about 1/10 to ⅓ of the rod radius) and the draw rate (ranging from about 0.5 to 8 mm/min.) through the rod are matched to the desired peripheral depletion of the dopant in the so-processed rod or the introduced quantity of dopant is matched to the desired peripheral enrichment of the dopant in the so-processed rod.

In one embodiment of the invention, the homogeneously n-doped silicon rod used in the peripheral zone melt cycle is produced via neutron irradiation and in other embodiments of the invention such homogeneously n-doped silicon rod is produced via classical pyrolytic deposition processes wherein gaseous silicon compounds and gaseous phosphorous compounds are thermally decomposed so as to deposit silicon and phosphorous on carrier members.

DESCRIPTION OF THE PREFERRED EMBODIMENTS

Figure 1:
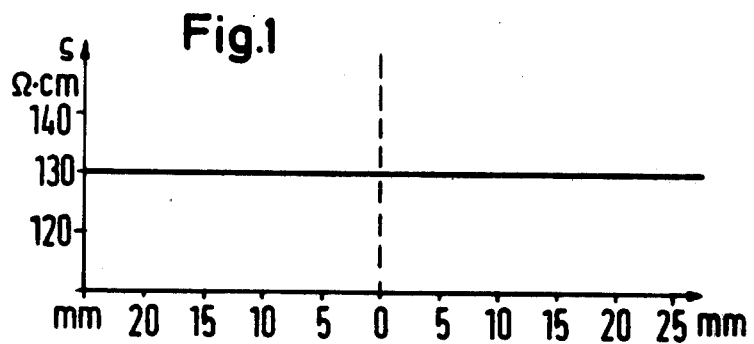
FIG. 1 is a graphical illustration of the specific electrical resistance ($\rho$) profile along a radial path of a silicon wafer cut from a homogeneously doped silicon monocrystalline rod used in the practice of the invention.

The invention provides silicon monocrystalline rods suitable for use in the manufacture of special semiconductor components, such as high-power thyristors which have an n-conductive zone therein exhibiting a first uniform resistance value along the center thereof and exhibiting a second uniform resistance value along the peripheral edges thereof and a method of manufacturing n-doped silicon monocrystalline rods which can be divided up to produce wafers having such two radially spaced apart resistance value zones therein.

In accordance with the principles of the invention, a silicon monocrystalline rod characterized by a substantially homogeneous phosphorous doping concentration therein is subjected to a zone melt refining process in a select atmosphere and under such conditions that a peripheral melt zone is generated about the rod having a depth less than the rod radius and is drawing through the rod at least once whereby the depth of the melt zone and the draw rate is matched to a desired peripheral depletion of the rod and the quantity of the dopant which is added is matched to a desired peripheral enrichment of the rod.

An article by M. Tanenbaum and A. D. Mills in "Journal of the Electrochemical Society", Vol. 108, No. 2, 1961, pages 171–176, suggests that one may produce homogeneous n-conductive silicon crystals by irradiating such crystals with thermal neutrons. During such neutron irradiation, the natural isotope $Si^{30}$ present in the silicon crystal is transmuted into the unstable isotope $Si^{31}$ by the capture of a thermal neutron and emission of $\gamma$-radiation. The $Si^{31}$ isotope then decays by $\beta$—radiation with a half life of 2.62 hours into stable $P^{31}$ isotope.

From the foregoing, a so-called radioactive doping may be achieved in accordance with the nuclear reaction:

$$Si^{30}(n, \gamma) Si^{31} \underline{\beta^-} P^{31} \qquad (I)$$

so that by presuming that the entire amount of $Si^{31}$ is completely decayed and that the transmutation loss of $Si^{30}$ is negligibly small, the following simple computation may be applied:

$$C_P = 2.0 \times 10^{-4} \times \Phi \times t \tag{II}$$

wherein $C_P$ is the phosphorous concentration in atoms/cm$^3$;
$\Phi$ is the thermal neutron flux in neutrons/cm$^2 \times$ sec.; and $t$ is the irradiation time in seconds.

The invention utilizes the foregoing concepts and in one embodiment of the invention, the requisite homogeneously phosphorous doped silicon monocrystalline rod is obtained by irradiating a suitable silicon monocrystalline rod with neutrons so that the known reaction:

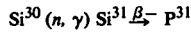

occurs. The results of this so-called radioactive doping is that a striation-free doping which is extremely homogeneous throughout the entire rod is achieved in the silicon crystal independent of the rod diameter. This concept is extremely useful in providing n-silicon having a specific resistance of more than 30 ohm · cm, with an exact and homogeneous dopant distribution therein.

In another embodiment of the invention, the homogeneously phosphorous doped silicon monocrystalline rod is obtained by forming a stream of a gas comprised of a carrier gas having a select quantity of an easily vaporizable phosphorous compound therein and directing such gas stream into a melt zone during a zone melt refining process. Alternatively, a homogeneous phosphorous doping may be achieved during the production of a polycrystalline silicon rod via pyrolytic deposition from a thermally decomposable gaseous silicon compound and a thermally decomposable gaseous phosphorous compound onto a silicon carrier member. Typically, silicochloroform or silicon tetrachloride may be used as the thermally decomposable gaseous silicon compound and hydrogen phosphide or phosphornitrilochloride (both of which are readily vaporizable) may be used as the thermally decomposable gaseous phosphorous compound. After the so-produced polycrystalline rod is attained, it may be zone melt refined so as to form the monocrystalline state and then be subjected to the peripheral zone melt refining step of the invention described earlier. Alternatively, the starting homogeneously phosphorous doped starting rod may also be produced by pyrolytic deposition of silicon from a suitable gas phase (i.e., a mixture of hydrogen and silicochloroform) onto a doped silicon carrier member and the entire structure so-attained then be subjected to a subsequent zone melt refining to distribute the dopant therein uniformly over the entire rod.

The radioactive doping process initially described is preferably utilized in the practice of the invention to achieve a homogeneous distribution of dopant within the crystalline rod, rather than the more or less classic pyrolytic doping processes described.

In accordance with the principles of the invention, the production of a surface or peripheral melt zone is achieved with the aid of a single-turn flat coil having an inner diameter which is less than 10 mm larger than the diameter of the rod being processed. Such a coil is positioned so as to annularly encompass the rod and is operationally coupled to a suitable energy source, such as a high-frequency generator and a melt zone having a depth ranging from about 1/10 to ⅓ of the radius of the rod being processed is thus generated about the rod and is drawn at least once throughout the entire rod length.

In another embodiment of the invention, a plurality of coils arranged in series about the rod may be utilized, either all operating simultaneously with the same energy level or each coil may be provided with a different energy level. In this manner, a plurality of variations in the radial dopant profile of a so-processed monocrystalline rod may be readily attained.

Figure 2:
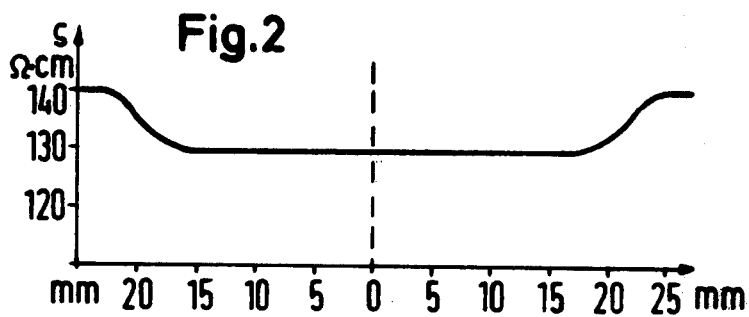
FIG. 2 is a somewhat similar illustration of a specific electrical resistance profile of a silicon wafer cut from a silicon monocrystalline rod processed in accordance with the principles of the invention.
Figure 3:
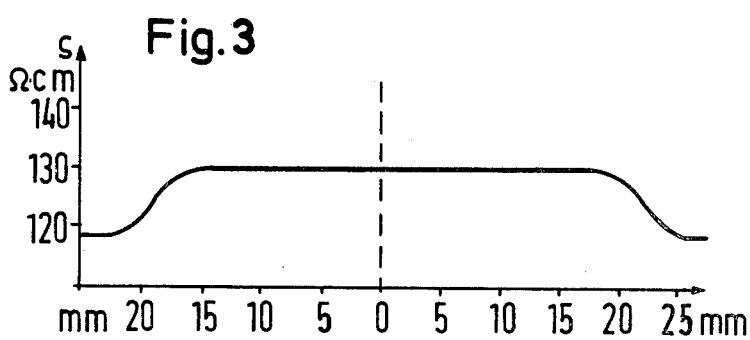
FIG. 3 is also a somewhat similar illustration to that of FIG. 2 illustrating the specific electrical resistance of a silicon wafer produced from a silicon monocrystalline rod processed in accordance with another embodiment of the invention.

In FIGS. 1, 2 and 3, the specific electrical resistance value ($\rho$) radially measured on various crystal wafers is plotted in ohm · cm ($\Omega$ · cm) on the ordinate while the distance from wafer edge to wafer edge is plotted on the abscissa. The broken center line shows the center of the respective wafer.

A starting silicon monocrystalline rod having the radial resistance profile shown at FIG. 1 may be provided via radioactive doping or via the more conventional doping procedures set forth earlier. So that the invention may be better understood, an exemplary embodiment for achieving such homogeneously doped monocrystalline rod is set forth below.

A polycrystalline silicon rod may be attained or produced via pyrolytic deposition and is then zone melted in a vacuum and subsequently or simultaneously therewith, a seed crystal, preferably having a (111)-orientation, is fused onto the rod. The resultant silicon monocrystalline rod exhibits a specific resistance of 1230 ohm · cm, n-type. After two further zone melt cycles in vacuum, a specific resistance of 2300 ohm · cm, p-type is obtained. As a result of the resistance analysis, it is determined that the dominant p-impurity in this crystal rod is the element boron. Calculating from the resistance value, the boron concentration is determined to correspond to $5.6 \times 10^{12}$ boron atoms/cm$^3$ of silicon. The target or desired resistance value of the n-doping in a silicon rod shown in FIG. 1 is 130 ohm · cm, i.e., $4 \times 10^{13}$ phosphorous atoms/cm$^3$ of silicon. Accordingly, the above procured zone melt treated silicon monocrystalline rod is placed in a nuclear reactor, the neutron flux thereof set at $8 \times 10^{13}$ neutrons/cm$^2$/sec. and the irradiation process is allowed to continue for about 1 hour. As a result of this irradiation, the resistance value of such rod changes to correspond to that shown in FIG. 1, n-type, corresponding to a phosphorous doping which is homogeneous throughout the entire rod cross-section and is free of resistance striations.

Figure 4:
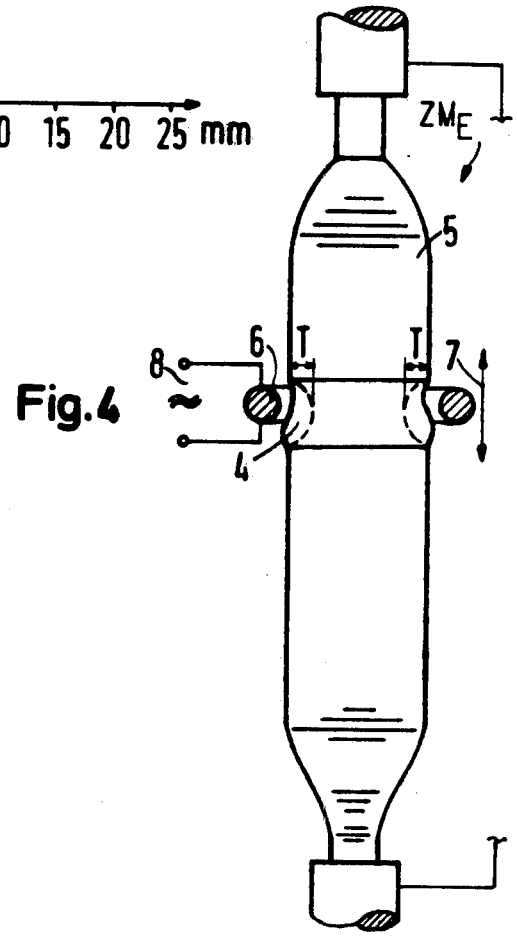
FIGS. 4 and 5 are somewhat schematic illustrations of a silicon monocrystalline rod undergoing the peripheral zone melt refining cycles used to produce the resistance profiles illustrated at FIGS. 2 and 3.

In order to achieve a resistance profile corresponding to that illustrated at FIG. 2, the above neutron-irradiated silicon rod is subjected to at least one peripheral zone melt cycle within an operational zone melt environment $ZM_E$ in accordance with the principles of the invention as illustrated at FIG. 4. As can be seen from FIG. 4, an induction heating coil 6 is operationally connected to a controlled voltage source 8 and is positioned within the zone melt environment $ZM_E$, typically comprised of a chamber having a select atmosphere or vacuum therein. Upon energization, the coil 6 generates the controllable melt zone 4 (shown in broken lines) which has a depth T that is less than the radius of the silicon rod 5. The melt zone 4 is drawn at a controlled rate generally in the range of about 0.5 to 8 mm/min. and more preferably at 2 mm/min. at least once through the entire length of the rod via relative axial movement between the coil and the rod so as to complete at least one zone melt cycle. As schematically indicated by the double-headed arrow 7, the drawing direction, whether upward or downward, is of no material significance in the practice of the invention. The rod 5 may be rotated about its longitudinal axis at a rate of about 2 to 10 revolutions per minute. During such a peripheral zone melt cycle, the number of phosphorous atoms which vaporize from the surface melt zone 4 (having a depth T) of the silicon crystalline rod 5 in vacuum (= degree and depth of the peripheral depletion) will depend, after taking into account the vaporization coefficient of phosphorous, upon the following parameters:

1. The quantity of HF-energy supplied to the induction heating coil.
2. The distance between the inner edge of the heating coil and the outer edge of the crystal rod, as well as the geometric configuration of the coil.
3. The drawing rate of the melt zone through the crystal rod.
4. The number of melt zone cycles passed through the crystal rod.

In producing the resistance profile shown at FIG. 2, the following exemplary parameters were utilized:
rod diameter: 53 mm
inner coil diameter: 60 mm
height of melt zone: 7 mm
depth of melt zone: 5 mm
drawing rate: 2 mm/min.
number of zone melt cycles: 1
rotation rate of crystal rod: 2–10 Rev./min.

By proceeding in accordance with the principles of the invention, one may produce resistance profiles ($\rho$-profiles) other than that illustrated at FIG. 2. For example, a plurality of induction heating coils coupled in series with a single voltage source and arranged in series about a crystalline rod may be simultaneously moved through the rod. Alternatively, such a plurality of coils may be coupled with different HF-energy sources.

The process of the invention is independent of the crystal orientation of the starting silicon rod. In embodiments where crystals having a (100)-orientation are desired, it is possible to use classic doping processes (i.e., doping the starting rod with vaporizable phosphorous compounds), because the inhomogeneities of such starting materials are less than with crystals having a (111)-orientation.

Figure 5:
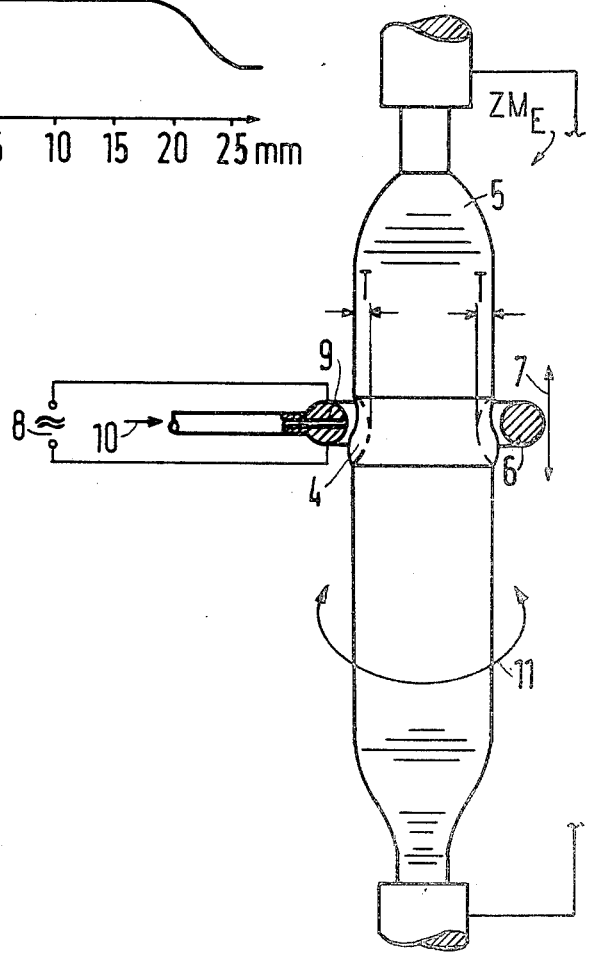

In order to achieve a resistance profile corresponding to that illustrated at FIG. 3, the starting silicon crystalline rod 5 which was first neutron-irradiated as described earlier so as to exhibit the resistance profile shown at FIG. 1, is placed within an operational zone melt environment $ZM_E$ as schematically illustrated at FIG. 5. As shown, an induction heating coil 6 is operationally coupled to a HF-energy source 8 and is positioned within the zone melt environment $ZM_E$ so as to annularly encompass the rod 5. Upon controlled energization of coil 6, a peripheral melt zone 4 having a depth T, which is less than the radius of the rod 5, is generated on the periphery of the rod and is drawn at least once through the rod. The depth T of the melt zone 4 is controlled via the energy fed to coil 6. In the embodiment shown, coil 6 includes a gas passage 9 so that a gas, for example, comprised of argon as a carrier gas and a dopant gas, such as consisting of phosphorousnitrilochloride, can be fed from a source 10 at a slightly positive pressure (about 0.15 atu) so that a select amount of dopant can be introduced directly into the peripheral melt zone 4. Further details of this type of coil structure may be obtained from German Pat. No. 2,020,182, which is incorporated herein by reference. The dopant concentration in the peripheral zone of the silicon rod processed in accordance with the above embodiments of the invention is dependent upon the following parameters:

1. The concentration of phosphorous atoms initially produced by neutron doping.
2. The flow rate of the gas stream directed into the peripheral melt zone.
3. The concentration of the vaporizable phosphorous compound (i.e., phosphorousnitrilochloride) in the carrier gas (determined by the vapor pressure of the dopant).
4. The amount of HF-energy supplied to the induction heating coil.
5. The distance between the inner edge of the coil and the outer edge of the rod as well as the geometrical configuration of the coil.
6. The number of zone melt cycles passes through the rod.
7. The drawing rate of the melt zone through the rod.

As schematically indicated by the double-headed arrow 7, during the zone melt process there is a relative axial movement between the rod 5 and the coil 6 but the direction of the draw is of no material significance in the practice of the invention. The draw rate may range from about 0.5 to 8 mm/min. and preferably is at about 2 mm/min. The crystal rod 5 may be rotated about the longitudinal axis thereof as schematically indicated by arrow 11 at a rate of about 2 to 10 Rev./min. and the direction of rotation is of no material significance in the practice of the invention.

In producing the resistance profile shown at FIG. 3, the following exemplary parameters were utilized:
rod diameter: 53 mm
inner coil diameter: 60 mm
height of melt zone: 7 mm
depth of melt zone: 5 mm
drawing rate: 2 mm/min.
number of zone melt cycles: 1
rotation rate of crystal rod: 2–10 Rev./min.
flow rate of gas stream impinging on melt zone: 5 1/hour
temperature of the source containing phosphorousnitrilochloride: 0° C.
vapor pressure of the phosphorousnitrilochloride at 20° C.: $5 \times 10^3$ Torr.

In an alternative embodiment of the invention, the means of supplying dopant to the melt zone illustrated at FIG. 5 may be replaced with a dopant passageway positioned in the region of the heating coil and which includes adjustment means allowing the nozzle or opening of the passageway to be moved toward and away from the peripheral melt zone on the rod being treated.

In yet another embodiment of the invention, the desired doping of the peripheral melt zone may be accomplished during a zone melt cycle via an encompassing gas atmosphere having a predetermined dopant concentration therein and which is maintained at a slightly positive pressure within an operational zone melt environment $ZM_E$.

By practicing the principles of the invention, one can produce silicon monocrystalline rods which exhibit, at a cross-section thereof, a first substantially uniform dopant concentration at the center zone of such cross-section and a second substantially uniform dopant concentration (which is different, i.e., higher or lower, than the first dopant concentration) at the peripheral edge zone of such cross-section. The peripheral zone melt process used in the practice of the invention produces dislocations or the like in the processed crystal which have an approximately uniform distribution. While such dislocations may be removed by annealing or the like if desired, no healing thereof is necessary because silicon wafers cut from such rods are further processed into special semiconductor components and such further processing involves healing operations or, in the manufacture of certain semiconductor components, such as thyristors, it is desirable for the crystal wafer to have dislocations therein which are distributed as homogeneously as possible through select zones thereof.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A process for producing a phosphorous-doped silicon monocrystal having a radially peripheral dopant concentration lower than the dopant concentration at the center of such monocrystal, comprising:

providing a silicon monocrystalline rod having a substantially homogeneous phosphorous doping throughout such rod by controllably irradiating said rod with thermal neutrons so that the reactions:

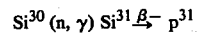

occurs within said rod and yields a homogeneous phosphorous doped silicon monocrystalline rod;

subjecting said homogeneously phosphorous doped rod to at least one peripheral zone melt cycle in a select atmosphere in such a manner that a melt zone is generated about said rod so as to have a depth which ranges between about 1/10 to ⅓ the radius of said rod and said melt zone is drawn at least once through said rod; and adjusting the draw rate of said peripheral melt zone through said rod so as to range from about 0.5 mm/min to about 8 mm/min to attain the desired peripheral dopant concentration in said rod.

2. A process as defined in claim 1 wherein a single-turn induction heating coil having an inner diameter which is less than 10 mm larger than the diameter of the rod is used to generate said melt zone during the peripheral melt zone cycle.

* * * * *